(12) United States Patent
Wang et al.

(10) Patent No.: US 10,879,124 B2
(45) Date of Patent: Dec. 29, 2020

(54) METHOD TO FORM A FULLY STRAINED CHANNEL REGION

(71) Applicant: Taiwan Semiconductor Manufacturing Co., Ltd., Hsinchu (TW)

(72) Inventors: Chun-Chieh Wang, Kaohsiung (TW); Huai-Tei Yang, Hsin-Chu (TW); Zheng-Yang Pan, Zhubei (TW); Shahaji B. More, Hsinchu (TW); Shih-Chieh Chang, Taipei (TW); Cheng-Han Lee, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/819,129

(22) Filed: Nov. 21, 2017

(65) Prior Publication Data

US 2019/0157154 A1 May 23, 2019

(51) Int. Cl.
*H01L 21/8234* (2006.01)
*H01L 21/8238* (2006.01)
(Continued)

(52) U.S. Cl.
CPC ......... *H01L 21/823412* (2013.01); *H01L 21/823431* (2013.01); *H01L 21/823481* (2013.01);
(Continued)

(58) Field of Classification Search
CPC ..... H01L 21/823431; H01L 21/823821; H01L 21/845; H01L 29/0886; H01L 29/0924; H01L 29/10826; H01L 29/10879; H01L 29/1211; H01L 29/04–045; H01L 29/16–1608; H01L 29/18–185; H01L 29/22–2206; H01L 29/36–365; H01L 29/7851; H01L 29/7853–7856; H01L 29/66803; H01L 29/66818; H01L 27/41791; H01L 27/10826; H01L 27/66795; H01L 27/66818;
(Continued)

(56) References Cited

U.S. PATENT DOCUMENTS 8,617,996 B1 * 12/2013 Chi ................... H01L 21/30604
257/E21.377
9,299,557 B2 * 3/2016 Tolle ................. H01L 21/02049
(Continued)

*Primary Examiner* — Maliheh Malek
(74) *Attorney, Agent, or Firm* — Sterne, Kessler, Goldstein & Fox P.L.L.C.

(57) ABSTRACT

The present disclosure describes an exemplary fabrication method of a p-type fully strained channel that can suppress the formation of {111} facets during a silicon germanium epitaxial growth. The exemplary method includes the formation of silicon epitaxial layer on a top, carbon-doped region of an n-type region. A recess is formed in the silicon epitaxial layer via etching, where the recess exposes the top, carbon-doped region of the n-type region. A silicon seed layer is grown in the recess, and a silicon germanium layer is subsequently epitaxially grown on the silicon seed layer to fill the recess. The silicon seed layer can suppress the formation of growth defects such as, for example, {111} facets, during the silicon germanium epitaxial layer growth.

20 Claims, 14 Drawing Sheets

(51) Int. Cl.
    *H01L 21/84*     (2006.01)
    *H01L 27/088*     (2006.01)
    *H01L 29/06*     (2006.01)
    *H01L 29/10*     (2006.01)

(52) U.S. Cl.
    CPC ........... *H01L 21/823807* (2013.01); *H01L 21/823821* (2013.01); *H01L 27/0886* (2013.01); *H01L 29/0649* (2013.01); *H01L 29/1054* (2013.01); *H01L 21/845* (2013.01)

(58) Field of Classification Search
    CPC ............ H01L 27/10879; H01L 27/785; H01L 27/7856; H01L 27/1211; H01L 27/0924; H01L 27/0886; H01L 2029/7857–7858; H01L 2924/13067
    See application file for complete search history.

(56) References Cited

U.S. PATENT DOCUMENTS

| | | | | |
|---|---|---|---|---|
| 9,515,073 | B1* | 12/2016 | Jagannathan | H01L 21/845 |
| 9,653,465 | B1* | 5/2017 | Balakrishnan | H01L 27/088 |
| 9,716,170 | B1* | 7/2017 | Cheng | H01L 29/7827 |
| 9,735,253 | B1* | 8/2017 | Bi | H01L 29/66666 |
| 9,859,164 | B1* | 1/2018 | Hsieh | H01L 21/823431 |
| 10,096,692 | B1* | 10/2018 | Cheng | H01L 29/6653 |
| 10,164,048 | B1* | 12/2018 | More | H01L 29/665 |
| 10,535,523 | B1* | 1/2020 | Lin | H01L 21/28556 |
| 10,535,736 | B2* | 1/2020 | More | H01L 27/0928 |
| 10,686,074 | B2* | 6/2020 | Tsai | H01L 29/7851 |
| 10,720,530 | B2* | 7/2020 | Ma | H01L 29/785 |
| 2005/0142687 | A1* | 6/2005 | Benzel | B81C 1/00182 438/53 |
| 2011/0006399 | A1* | 1/2011 | Takada | H01L 21/02381 257/616 |
| 2013/0200433 | A1* | 8/2013 | Adam | H01L 29/66545 257/190 |
| 2014/0061820 | A1* | 3/2014 | Reznicek | H01L 21/823821 257/401 |
| 2014/0339643 | A1* | 11/2014 | Cheng | H01L 21/76224 257/369 |
| 2015/0270122 | A1* | 9/2015 | Tolle | H01L 21/31116 438/607 |
| 2015/0270344 | A1* | 9/2015 | Cheng | H01L 29/161 257/616 |
| 2015/0311341 | A1* | 10/2015 | Hur | H01L 21/02532 257/190 |
| 2016/0049335 | A1* | 2/2016 | Liu | H01L 21/823431 438/283 |
| 2016/0086858 | A1* | 3/2016 | Cheng | H01L 21/823821 257/618 |
| 2016/0148932 | A1* | 5/2016 | Fujita | H01L 27/0921 257/372 |
| 2016/0225674 | A1* | 8/2016 | Jacob | H01L 21/823821 |
| 2016/0379981 | A1* | 12/2016 | Balakrishnan | H01L 27/0924 257/192 |
| 2017/0229463 | A1* | 8/2017 | Bergendahl | H01L 29/7848 |
| 2017/0250183 | A1* | 8/2017 | Brunco | H01L 27/0924 |
| 2018/0151378 | A1* | 5/2018 | Huang | H01L 29/7851 |
| 2018/0174913 | A1* | 6/2018 | More | H01L 21/823431 |
| 2018/0197793 | A1* | 7/2018 | Guo | H01L 21/823821 |
| 2018/0315663 | A1* | 11/2018 | Bao | H01L 21/823821 |
| 2018/0337256 | A1* | 11/2018 | Anderson | H01L 29/66666 |
| 2019/0096997 | A1* | 3/2019 | More | H01L 21/823821 |
| 2019/0097019 | A1* | 3/2019 | Zhao | H01L 29/6681 |
| 2019/0109177 | A1* | 4/2019 | Chanemougame | H01L 27/2454 |
| 2019/0139969 | A1* | 5/2019 | Yin | H01L 21/823431 |
| 2019/0148528 | A1* | 5/2019 | Yu | H01L 29/66795 257/288 |
| 2019/0148551 | A1* | 5/2019 | More | H01L 21/823821 257/192 |
| 2019/0165175 | A1* | 5/2019 | More | H01L 29/7848 |
| 2020/0152742 | A1* | 5/2020 | More | H01L 21/02057 |

* cited by examiner

\# METHOD TO FORM A FULLY STRAINED CHANNEL REGION

BACKGROUND

A fully strained channel in a complementary metal oxide semiconductor (CMOS) device can improve carrier mobility and reduce channel resistance of the device. Additionally, a strain-induced drive current enhancement (due to carrier mobility improvements) can be achieved for CMOS devices with scaled channel lengths.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

DETAILED DESCRIPTION

Figure 1:
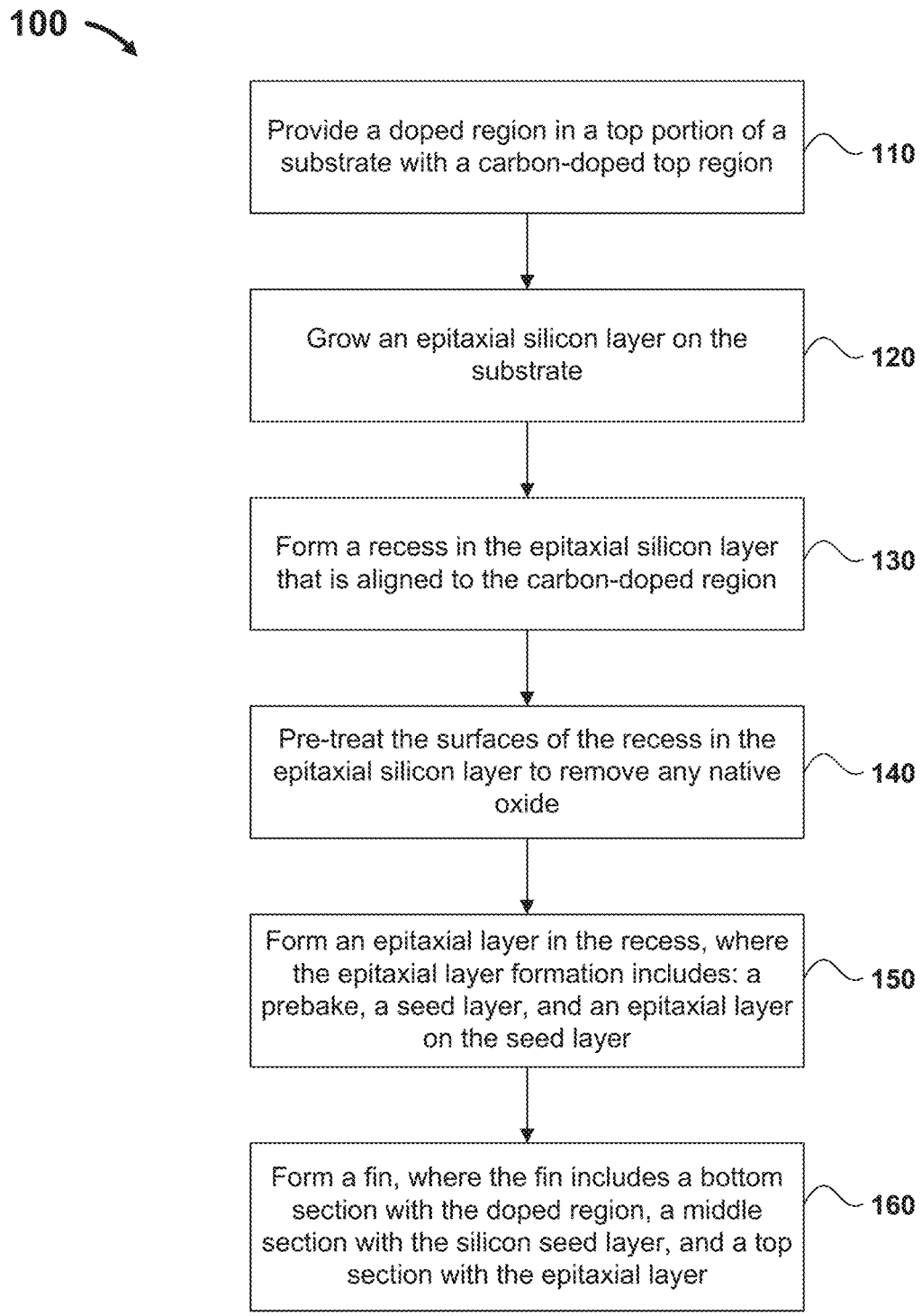
FIG. 1 is a flow chart diagram of an exemplary fabrication method to form a fully strained channel region on a fin, according to some embodiments

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The acronym "FET," as used herein, refers to a field effect transistor. A type of FET is referred to herein as a metal oxide semiconductor field effect transistor (MOSFET). MOSFETs can be planar structures built in and on the planar surface of a substrate such as, for example, a semiconductor wafer. MOSFETs can also be three-dimensional, vertically-oriented structures with a semiconductor material called "fins." The term "finFET" refers to a FET that is formed over a semiconductor (e.g., silicon) fin that is vertically oriented with respect to the planar surface of a wafer.

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes or tolerances. Unless defined otherwise, technical and scientific terms used herein have the same meanings as commonly understood by one of ordinary skill in the art to which this disclosure belongs.

A fully strained channel in a complementary metal oxide semiconductor (CMOS) device can improve carrier mobility and reduce channel resistance of the device. Additionally, a strain-induced drive current enhancement (due to carrier mobility improvements) can be retained for CMOS devices with scaled channel lengths. The materials used in strained channels can be different for p-type field effect transistors (PFETs) and n-type field effect transistors (NFETs). By way of example and not limitation, electron mobility in an NFET can be enhanced with the use of fully strained silicon/carbon-doped silicon (Si/Si:C) channels, while hole mobility in PFETs can be enhanced with fully strained silicon germanium (SiGe) channels.

The fully strained epitaxial channels can be formed on a top portion of a silicon (Si) fin. For example, the formation process of a p-type fully strain channel includes etching a portion of a Si epitaxial layer over a doped region to form a recess in the Si epitaxial layer and subsequently growing a SiGe epitaxial layer in the recess. The etch operation can damage the etched surfaces of the Si epitaxial layer. A SiGe epitaxial layer grown over a damaged Si surface can develop defects such as, for example, {111} facets. The {111} facets can act as scattering centers for electrons and can offset the mobility benefits of the p-type fully strained channel.

The embodiments described herein are directed to an exemplary fabrication method of p-type fully strained channel (PFSC) that can suppress the formation of {111} facets during a SiGe epitaxial growth. According to some embodiments, the exemplary fabrication process can include an n-doped region with a top carbon-doped (C-doped) region over a substrate. A Si epitaxial layer is formed on the top C-doped top region of the n-type region. A recess is formed in the Si epitaxial layer via etching, where the recess exposes the top C-doped region of the n-type region. A Si seed layer is epitaxially grown in the recess, and a SiGe layer is grown on the Si seed layer to fill the recess. The Si seed layer can suppress growth defects-such as, for example, {111} facets—in the SiGe epitaxial layer.

FIG. 1 is a flow chart diagram of an exemplary fabrication 100. Fabrication process 100 can form a p-type, fully strained, SiGe channel region in a top portion of a fin where a transistor can have its channel. In some embodiments, exemplary fabrication method 100 can provide a SiGe channel region that may be substantially free from epitaxial growth defects such as, for example, {111} facets. Other fabrication operations may be performed between the various operations of exemplary fabrication method 100 and are omitted for clarity. Exemplary fabrication method 100 may not be limited to the operations described below and may include additional operations. The figures provided to describe exemplary fabrication method 100 are for illustrative purposes only and are not to scale. In addition, the figures may not reflect the actual geometry of actual structures, features, or films. Some structures, films, or geometries may have been deliberately augmented for illustrative purposes.

For example purposes, exemplary fabrication method 100 will be described in the context of PFSC formed in a top portion of a silicon fin. Additionally, as discussed above, exemplary fabrication method 100 can be used to form an n-type fully strained channel (NFSC).

Figure 2:
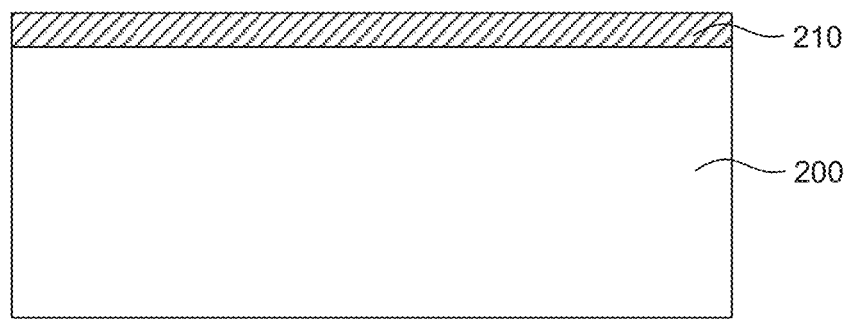
FIG. 2 is a cross-sectional view of a substrate with an oxide layer grown thereon, according to some embodiments.

Exemplary fabrication process 100 begins with operation 110, where a doped region is formed in a top portion of a substrate. According to operation 110, the doped region can have a carbon-doped top region. By way of example and not limitation, the doped region can be an n-type region and can be formed as follows. Referring to FIG. 2, an oxide layer 210 is deposited on a substrate 200. In some embodiments, substrate 200 can be a bulk semiconductor wafer or a semiconductor on insulator (SOI) wafer. Further, substrate 200 can be made of silicon (Si) or another elementary semiconductor such as, for example, (i) germanium (Ge); (ii) a compound semiconductor including silicon germanium (SiGe), silicon carbide (SiC), gallium arsenide (GaAs), gallium phosphide (GaP), indium phosphide (InP), indium arsenide (InAs), and/or indium antimonide (InSb); (iii) an alloy semiconductor including silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP); or (iv) combinations thereof. For example purposes, substrate 200 in exemplary fabrication method 100 will be described in the context of silicon. Based on the disclosure herein, other materials, as discussed above, can be used. These materials are within the spirit and scope of this disclosure.

In some embodiments, oxide layer 210 can have a thickness that can range from about 1 nm to about 500 nm. In some embodiments, oxide layer 210 is a silicon oxide ($SiO_2$) layer. According to some embodiments, oxide layer 210 can protect the top surface of substrate 200 from contamination, prevent excessive damage to substrate 200, and control the depth of dopants during an ion implantation step.

Figure 3:
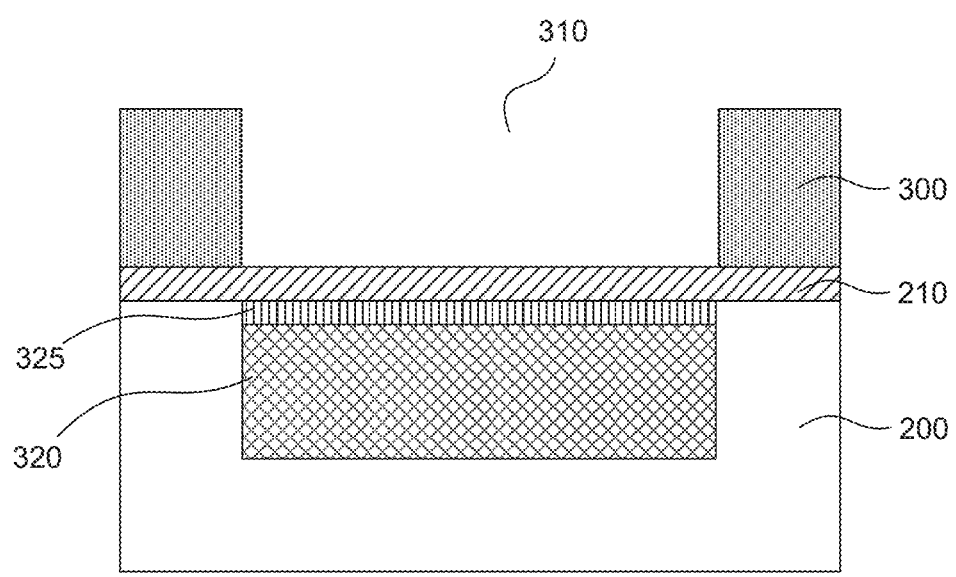
FIG. 3 is a cross-sectional view of an opening in a photoresist layer where the opening is aligned to a carbon-doped top region of an n-type region, according to some embodiments.

A photoresist layer 300 can then be deposited over oxide layer 210 as shown in FIG. 3. According to some embodiments, photoresist layer 300 can be patterned so that an opening 310 is formed over a portion of oxide layer 210, as shown in FIG. 3. In some embodiments, ion implantation can be used to form, for example, an n-type region 320 in substrate 200. In some embodiments, n-type region 320 is self-aligned to opening 310 since photoresist layer 300 can act as an implant mask. According to some embodiments, the n-type dopant may include (As), antimony (Sb), or phosphorous (P). According so some embodiments, the n-type dopant concentration in n-type region 320 can range from about $5 \times 10^{16}$ atoms/$cm^3$ to about $1 \times 10^{19}$ atoms/$cm^3$. In some embodiments, carbon (C) can be ion implanted to form a carbon-doped top surface layer on n-type region 325. Carbon is not an electron donor but it can impede the out-diffusion of the donor dopants from silicon such as, for example, As, Sb, or P. According to some embodiments, the C-doped top surface layer can have a thickness between about 100 nm and about 5000 nm and a carbon dopant concentration of about $1 \times 10^{17}$ about $1 \times 10^{20}$ atoms/$cm^3$. By way of example and not limitation, n-type region 320 can have a depth (e.g., in the z-direction) of about 100 nm to about 500 nm. The width (e.g., along the y-direction) and length (e.g., along the x-direction) can be different between devices in logic and static random access memory (SRAM) areas of the chip. After the formation of the n-type region, photoresist layer 300 can be removed.

Figure 4:
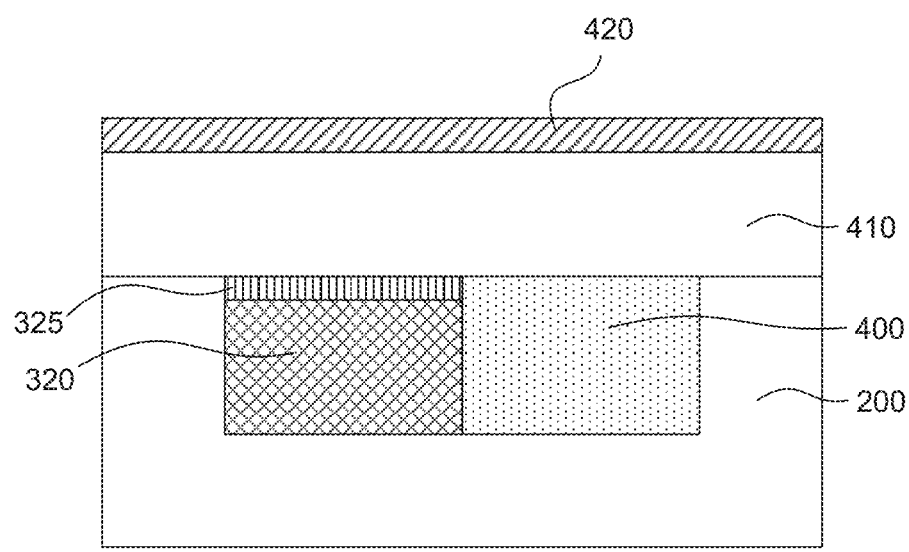
FIG. 4 is a cross-sectional view of a cap layer formed on a silicon epitaxial layer over p-type and n-type regions of a substrate, according to some embodiments

According to some embodiments, a similar process that involves patterning a photoresist layer and a subsequent ion implantation operation can be used to form a p-type region 400 in substrate 200 as shown in FIG. 4. P-type region 400 can be adjacent to n-type region 320. In some embodiments, p-type 400 region can be created with an ion implantation process using a p-type dopant such as, for example, boron (B). By way of example and not limitation, p-type region 400 can have a dopant concentration that ranges from about $5 \times 10^{16}$ atoms/$cm^3$ to about $1 \times 10^{19}$ atoms/$cm^3$.

After the formation of n- and p-type regions 320 and 400, respectively, any remaining photoresist layer can be removed with a wet clean process. In some embodiments, an annealing step is performed to electrically activate the dopants (e.g., move the dopants from interstitial sites in the silicon lattice to silicon lattice sites) and repair any silicon crystal damage that occurred during the ion implantation operation. By way of example and not limitation, crystal damage repair can occur at about 500° C. and dopant activation can occur at about 950° C. By way of example and not limitation, the annealing step can be performed in an annealing furnace or in a rapid thermal anneal (RTA) chamber. According to some embodiments, oxide layer 210 can be removed after the dopant activation anneal.

In referring to FIG. 1, in operation 120, a Si layer 410 can be epitaxially grown on substrate 200 as shown in FIG. 4. In some embodiments, Si epitaxial layer 410 can have a thickness range between about 1 nm and about 100 nm (e.g., 90 nm). By way of example and not limitation, Si epitaxial layer 410 can be deposited with a chemical vapor deposition (CVD) process. Possible source gases (or precursor gases) for the silicon epitaxial growth may include silane ($SiH_4$), silicon tetrachloride ($SiCl_4$), trichlorosilane (TCS), or dichlorosilane ($SiH_2Cl_2$ or DSC). Hydrogen ($H_2$) can be used as a reactant gas that reduces the aforementioned precursor gases. The deposition temperature during the epitaxial layer growth can range from about 700° C. to about 1250° C. depending on the gases used. For example, precursor gases with fewer chlorine atoms (e.g., DSC) may require lower formation temperatures compared to source gases with more chlorine atoms such as, for example, $SiCl_4$ or TCS. The aforementioned ranges and type of gases are provided as examples and are not limiting.

A cap layer 420 can be grown on Si epitaxial layer 410, according to some embodiments. The cap thickness layer 420 can have a thickness of about 150 Å or more (e.g., from about 150 Å to about 300 Å). In some embodiments, cap layer 420 can be an oxide layer such as, for example, $SiO_2$. Alternatively, cap layer 420 can be a nitride such as, for example, silicon nitride ($Si_3N_4$).

Figure 5:
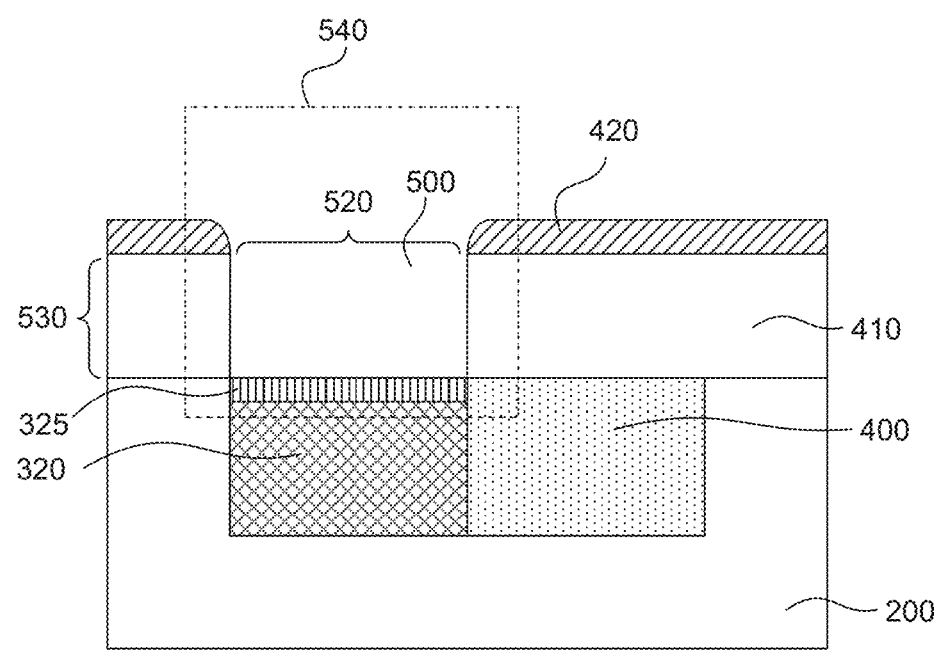
FIG. 5 is a cross-sectional view of a recess formed in a silicon epitaxial layer after an etch operation, according to some embodiments.

Referring to FIG. 5 and to operation 130, a recess, 500 can be formed in Si epitaxial layer 410 using a dry etch process. In some embodiments, recess 500 can be aligned to n-type region 320 using photolithography. By way of example and not limitation, a coat of photoresist can be applied on cap layer 420. The photoresist can be exposed and developed according to a desired pattern; for example, a desired pattern could be openings, which are aligned to n-type region 320 and expose a portion of cap layer 420. The unexposed areas of the photoresist can be removed with a wet clean, leaving behind the desired pattern of developed photoresist on cap layer 420. A dry etch process can subsequently remove exposed areas of cap layer 420 and continue to etch Si epitaxial layer 410 until n-type region 320 is exposed. The dry etch process can be "end-pointed" when it reaches C-doped layer 325. Areas of cap layer 420 covered with the developed photoresist (e.g., on p-type region 400) are protected from the etch chemistry of the dry etch process and are therefore not etched. Once the exposed areas of cap layer 420 and Si epitaxial layer 410 are etched, the remaining developed photoresist can be removed with a wet clean. The result of this process is etched portions in Si epitaxial layer 410, such as recess 500 shown in FIG. 5. In some embodiments, the dry etch process can use a different gas chemistry for cap 420 layer and Si epitaxial layer 410.

In some embodiments, recess 500 in Si epitaxial layer 41, has a width 520 and a height 530. Width 520 can range from about 0.5 nm to about 100 nm and can be nominally equal to the width of n-type region 320. In some embodiments, height 530 of recess 500 can range from about 1 nm to about 100 nm (e.g., 90 nm), which can be nominally equal to the thickness of Si epitaxial layer 410.

In some embodiments, after the formation of recess 500 in Si epitaxial layer 410, the edges of cap layer 420 at the top corners of recess 500 can become rounded. The rounding of cap layer 420 at the corners of recess 500 can be attributed to the etch process. Additionally, during the etch process, a portion of cap layer 420 may be etched, and therefore cap layer 420 may become thinner by the end of the etch process.

In referring to FIG. 1, in operation 140, the surfaces of recess 500 are pre-treated to remove native oxide that may have formed after the etch process. A native oxide layer of about 3 nm may grow naturally on a silicon surface after air exposure. According to some embodiments, a surface pre-treatment can include a two-step process: a plasma etch step and an anneal step. Surfaces of Si epitaxial layer 410 that are covered by cap layer 420 (e.g., the top surface of Si epitaxial layer 410 over p-type region 400) are not exposed to the surface pre-treatment and are not treated.

In some embodiments, the plasma etch step can include a mixture of nitrogen trifluoride ($NF_3$) and ammonia ($NH_3$) gases. The plasma may also include inert gases such as, for example, argon (Ar), helium (He), hydrogen ($H_2$), and nitrogen ($N_2$). By way of example and not limitation, the plasma etch can be performed at room temperature (e.g., about 24° C.) to about 150° C., at a pressure range from about 1 Torr to about 10 Torr (e.g., from 2 to 5 Torr). According to some embodiments, the plasma etch can remove native silicon oxide ($SiO_x$) from the exposed surfaces of recess 500 (e.g., along the sidewalls of Si epitaxial layer 410 and on the top surface of C-doped layer 325). In some embodiments, the plasma etch may include hydrochloric acid (HCl) vapors.

Figure 6:
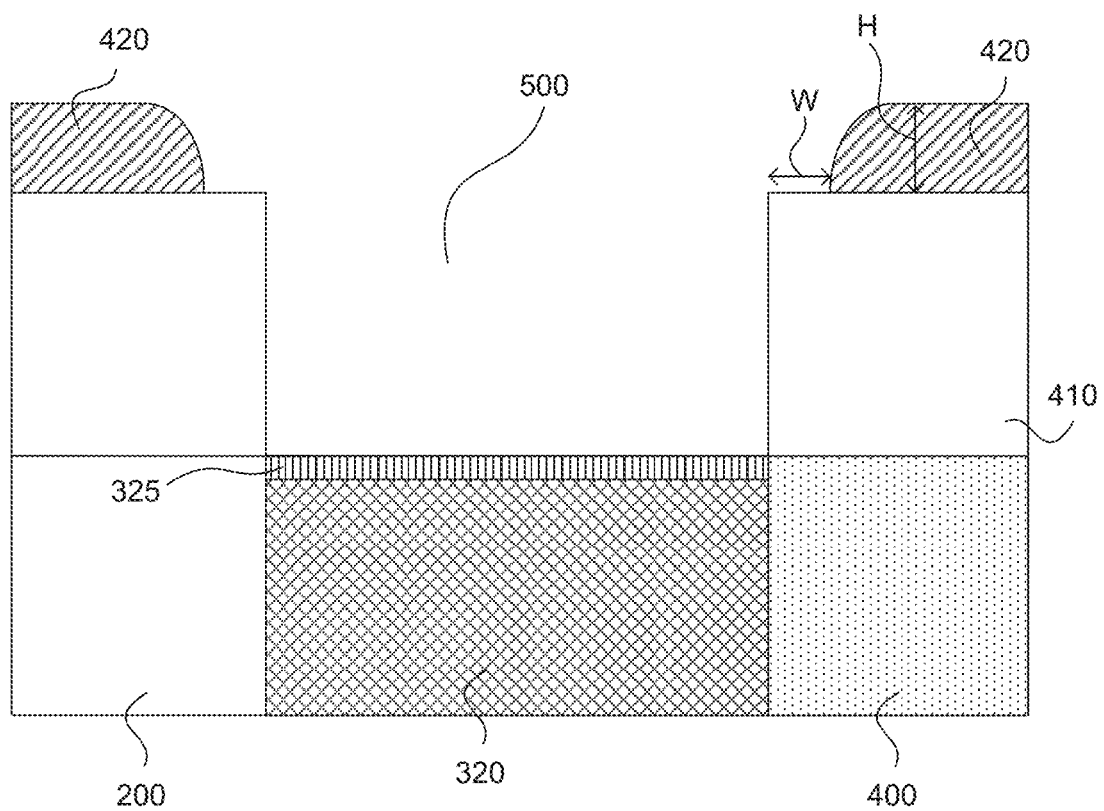
FIG. 6 is a cross-sectional view of a recess in a silicon epitaxial layer after a surface pre-clean treatment operation, according to some embodiments.

FIG. 6 is a magnified view of an area 540 of FIG. 5, which shows recess 500 after exposure to $NF_3$ and $NH_3$ plasma. Since $NF_3$ and $NH_3$ plasma targets silicon oxide, a portion of cap layer 420 will be etched during the plasma etch process. Consequently, the thickness of cap layer 420 (height H) at the top of Si epitaxial layer 410 is reduced. Additionally, a recess, having a width W, will be formed at the top corners of recess 500. As described earlier, the rounding of cap layer 420 can occur during the recess formation. In some embodiments, height H can be greater than or equal to recess width W (e.g., H≥W).

In some embodiments, the surface pre-treatment continues with an anneal step. The anneal step can be performed from about 30° C. to about 200° C. In some embodiments, the anneal step can be performed at a lower pressure than the plasma etch step; at a pressure lower than 1 Torr (e.g., 0.6 Torr). According to some embodiments, the anneal step can be performed in an inert gas ambient such as, for example, Ar, He, $N_2$, or a combination thereof. In some embodiments, the anneal step can induce outgassing of contaminants and moisture from the surfaces of recess 500. According to some embodiments, the anneal step can last up to about 30 s (e.g., 25s). In some embodiments, the surface pre-treatment (plasma etch and anneal) can be repeated as required to prepare the exposed surfaces of Si epitaxial recess 500.

Fabrication method 150 continues with operation 150 and the formation of an epitaxial layer in the recess. According to some embodiments, operation 150 may include three sub-operations: (i) a prebake, (ii) a formation of a Si seed layer, and (iii) a formation of an epitaxial layer over the Si seed layer.

According to some embodiments, the first sub-operation is a heat treatment, or a prebake, performed at a temperature T1 that can be higher than the subsequent seed and epitaxial layer formation temperatures T2 and T3 respectively. In other words. T1>T2, T3. For example, the prebake temperature T1 can be about 20% to about 30% higher than the seed and epitaxial layer formation temperatures T2 and T3. According to some embodiments, the prebake temperature can range from about 650° C. to about 1500° C. (e.g., 650° C. to 900° C. or 1000° C. to 1500° C.). In some embodiments, the prebake ambient can be an inert gas such as, for example, Ar, $N_2$, He, or combinations thereof. In some embodiments, the prebake can remove a native oxide from the inner surfaces of Si epitaxial recess 500 and improve the quality of the epitaxial layer that would be grown in a subsequent operation.

Figure 7:
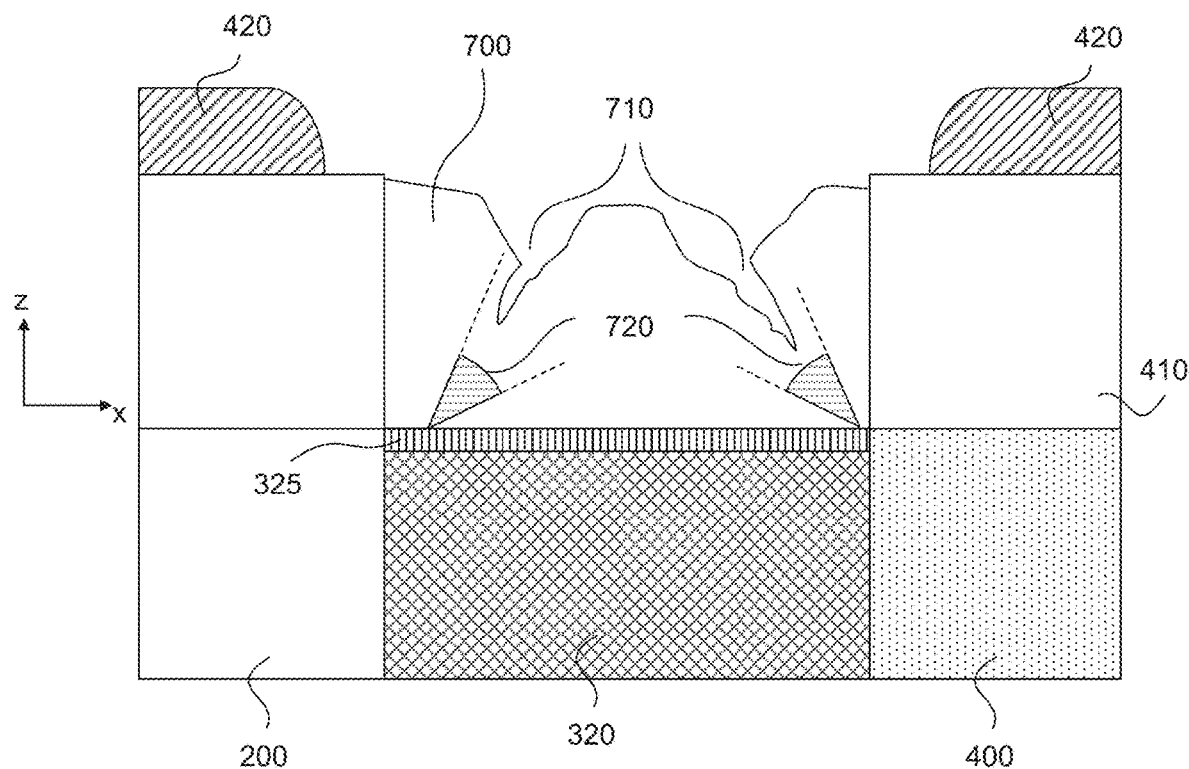
FIG. 7 is a cross-sectional view of a silicon germanium epitaxial layer with {111} facets, according to some embodiments.

In some embodiments, the dry etch process, which is used to form recess 500 in epitaxial layer 410, can create defects on the surfaces of recess 500 (e.g., on the surfaces of C-doped layer 325 of n-type region 320 and Si epitaxial layer 410). For example, the dry etch process can damage the Si lattice by creating Si tangling bonds (Si broken bonds) on the surfaces of recess 500. A damaged Si surface may appear rough in a transmission electron microscope (TEM) image. In some embodiments, if a SiGe layer 700 is grown on the damaged surfaces of Si recess 500, it can develop {111} facets 710 as shown in FIG. 7. {111} facets 710 can be formed at an angle 720, which can be measured from a plane parallel to a top surface of substrate 200 (e.g., x-y plane). By way of example and not limitation, angle 720 may range from about 35° to about 55°. The presence of dislocations in a channel region can compromise the mobility benefits of a fully strained SiGe layer because dislocation may act as scattering centers for electrons and therefore increase the electrical resistance of the channel. To repair the damaged Si surfaces, a Si seed layer can be deposited over the damaged Si surfaces of recess 500 according to some embodiments.

Figure 8:
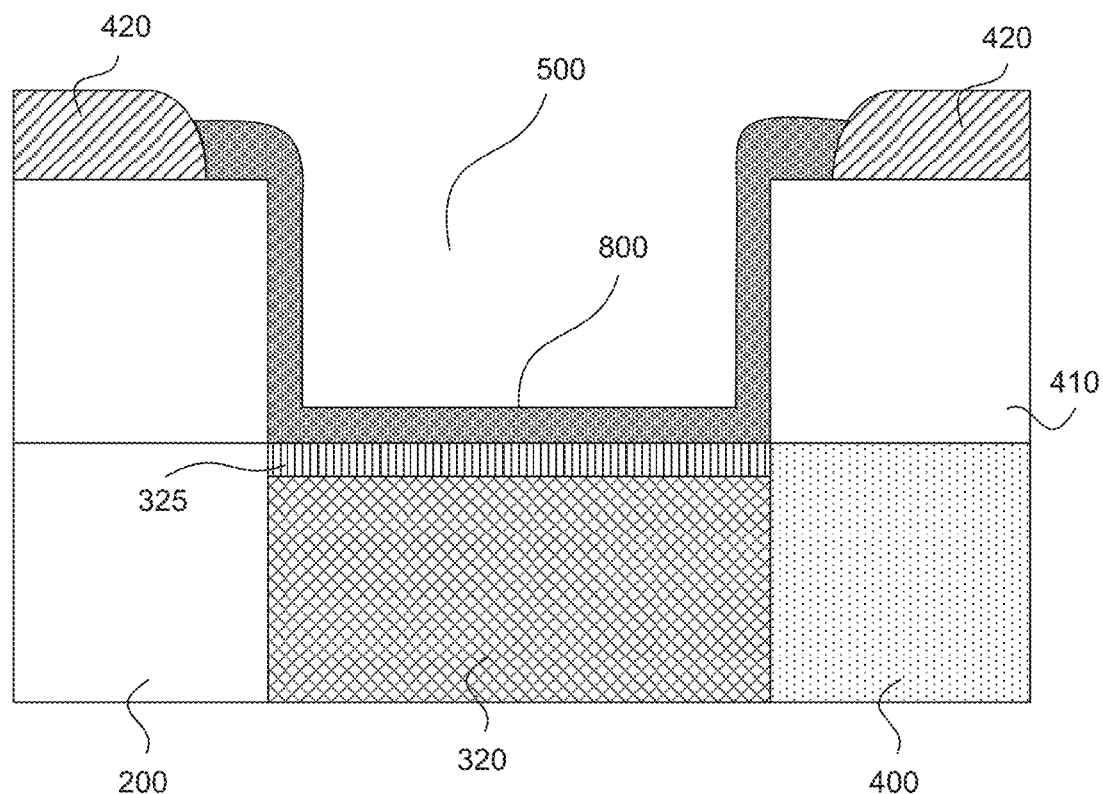
FIG. 8 is a cross-sectional view of a silicon seed layer grown in a recess within a silicon epitaxial layer, according to some embodiments.

In the second sub-operation of operation 150, a Si seed layer 800 is formed on exposed surfaces of recess 500 as shown in FIG. 8. According to some embodiments, Si seed layer 800 cannot grow on cap layer 420; for example, Si seed layer 800 cannot grow on SiO$_2$ or Si$_3$N$_4$. According to some embodiments, Si seed layer 800 can have a thickness that ranges from about 1 nm to about 5 nm. In some embodiments, Si seed layer 800 is not sufficiently thick to fill recess 500. In some embodiments, Si seed layer 800 can form an interface that may suppress the formation of {111} facets during a subsequent SiGe epitaxial growth. In some embodiments, an interface that can suppress {111} facets can occur naturally for a Si seed layer grown with the conditions described herein. In some embodiments, suppression of {111} facets can occur because the SiGe epitaxial growth can be accelerated in the <111> direction by Si seed layer 800, for example, at angles between about 25° and about 45° measured from a plane parallel to a top surface of substrate 200 (e.g., x-y plane). By way of example and not limitation, the seed layer can be deposited with a CVD process. In some embodiments, SiH$_4$ and/or DCS precursor gases can be used with H$_2$ or N$_2$ reactant gases to form Si seed layer 800. The aforementioned types of gases are exemplary and not limiting. In some embodiments, deposition temperature T2 of seed layer 800 may be equal or lower to growth temperature T3 of the SiGe epitaxial layer. Seed layer 800 deposition temperature T2 can range from about 450° C. to about 900° C. According to some embodiments, a higher quality seed layer (e.g., with fewer defects) can be obtained at the upper limit of the T2 range (e.g., about 750° C.). In some embodiments, the seed layer formation process can range from about 5 Torr to about 30 Torr (e.g., 15 Torr). According to some embodiments, the seed layer deposition time can range from about 5 s to about 15 s depending on the seed layer growth rate and the desired seed layer thickness. The aforementioned ranges are exemplary and not limiting. In some embodiments, Si seed layer 800 can have a thickness to prevent {111} facets but not occupy a significant area to be used in the subsequently formed channel.

In the third sub-operation of operation 150, an epitaxial layer is formed on Si seed layer 800 to fill Si epitaxial recess 500. A combination of (i) SiH$_4$, disilane (Si$_2$H$_6$), germane (GeH$_4$), hydrochloric acid (HCl), and (ii) H$_2$, N$_2$ or Ar can be used to form a SiGe seed layer. According to some embodiments, the epitaxial layer is SiGe and can be grown at a temperature T3. Growth temperature T3 can range from about 450° C. to about 900° C. with a limitation that T2≤T3. For example, if Si seed layer growth temperature T2 ranges from about 550° C. to about 650° C., SiGe growth temperature T3 can range from about 650° C. to about 750° C. Therefore T1>T3≥T2. In some embodiments, the as deposited SiGe can have a thickness from about 1 nm to about 200 nm.

Figure 9:
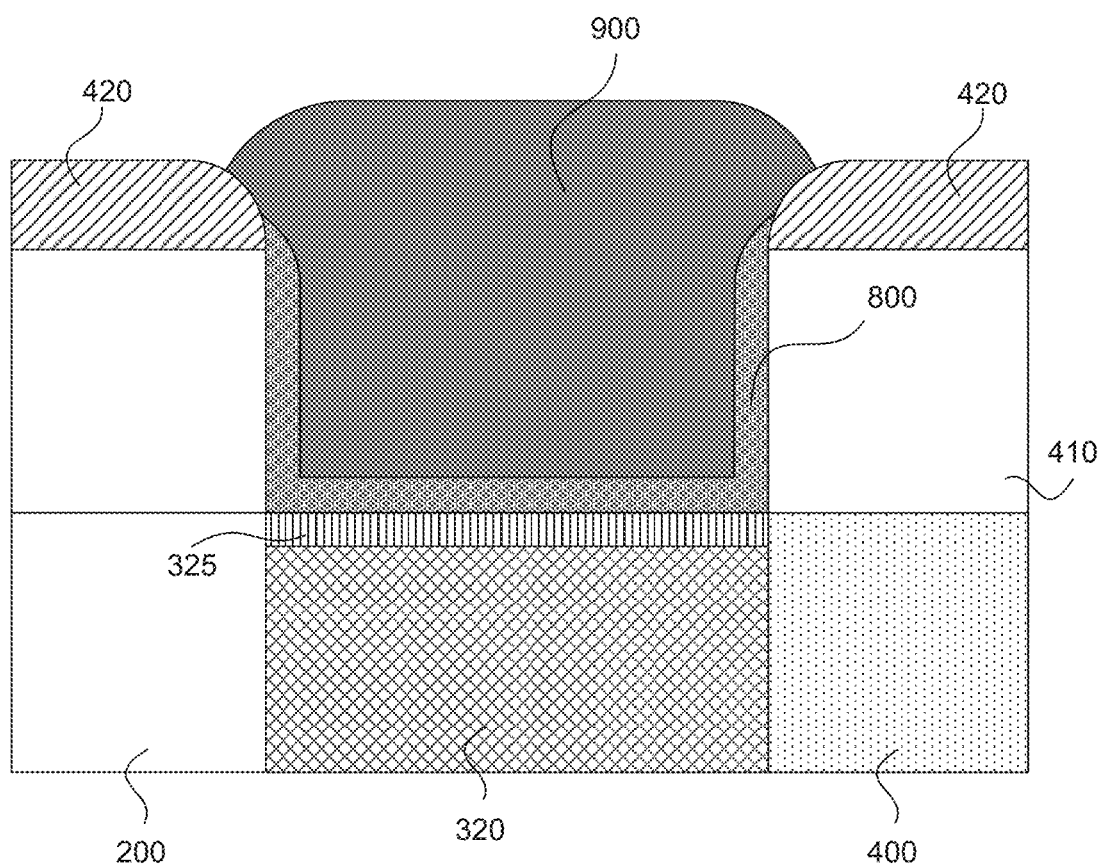
FIG. 9 is a cross-sectional view of a silicon germanium epitaxial layer grown on a silicon seed layer, according to some embodiments.
Figure 10:
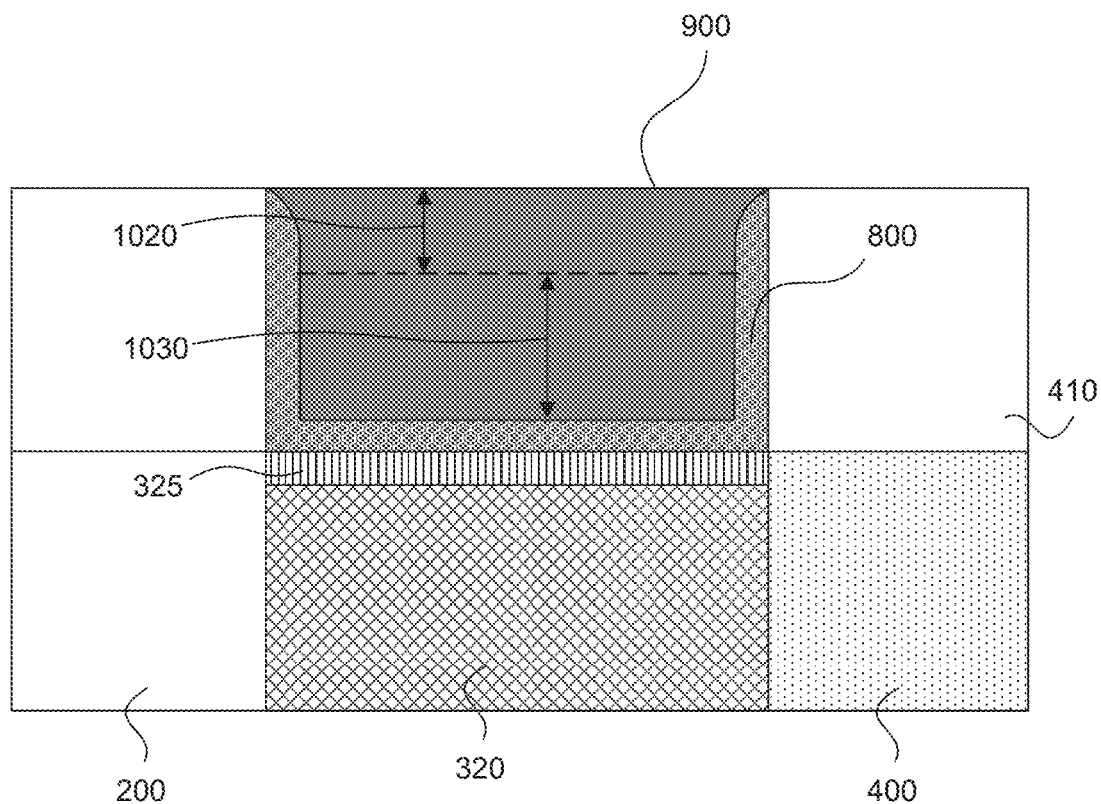
FIG. 10 is a cross-sectional view of a planarized silicon germanium epitaxial layer with two regions of different germanium concentration profiles grown on a silicon seed layer, according to some embodiments.

Referring to FIG. 9, a SiGe epitaxial layer 900 is grown in Si epitaxial recess 500 over seed layer 800. SiGe epitaxial layer 900 cannot grow on capping layer 420; for example, SiGe epitaxial layer 700 cannot grow on SiO$_2$ or Si$_3$N$_4$. In some embodiments, a subsequent chemical mechanical planarization (CMP) process can planarize the SiGe epitaxial layer 900 and Si epitaxial layer 410. FIG. 10 shows SiGe epitaxial layer 900 after a CMP operation. During the CMP operation, the cap layer 420, a portion of SiGe epitaxial layer 900, a portion of Si seed layer 800, and a portion of Si epitaxial layer 410 can be removed as shown in FIG. 10. In some embodiments, the thickness of SiGe epitaxial layer 900 after a CMP process can range from 1 nm to about 90 nm (e.g., 90 nm).

In some embodiments, SiGe epitaxial layer 900 can have two SiGe sub-layers with different Ge concentration profiles. For example, in some embodiments, SiGe epitaxial layer 900 may include a 25 nm thick top sub-layer 1020 and a bottom 65 nm thick sub-layer 1030 as shown in FIG. 10. In some embodiments, top sub-layer 1020 has a variable Ge concentration profile that increases from top to bottom along the z-axis at a rate of about 0.001 atomic % per nm to about 0.2 atomic % per nm. Therefore, within top sub-layer 1020, the Ge concentration profile can increase from about 0.3 atomic percent (at. %) on the surface of top sub-layer 1020 to about 5 at. % at the bottom of top sub-layer 1020. In some embodiments, the Ge concentration profile in bottom sub-layer 1030 can be constant throughout its thickness along the z-axis. The constant Ge concentration profile in bottom sub-layer 1030 can have any value between about 10 at. % and about 40 at. % (e.g., 30 at. %). In some embodiments, the formation of the two sub-layers with different Ge concentration profiles described above can be attributed to Si seed layer 800.

In some embodiments, the aforementioned sub-operations of operation 150 are successively performed without a vacuum break. For example, each sub-operation is performed in a different reactor of a cluster tool. In other words, the operation 150 of exemplary fabrication method 100 can be an in-situ process.

Figure 11:
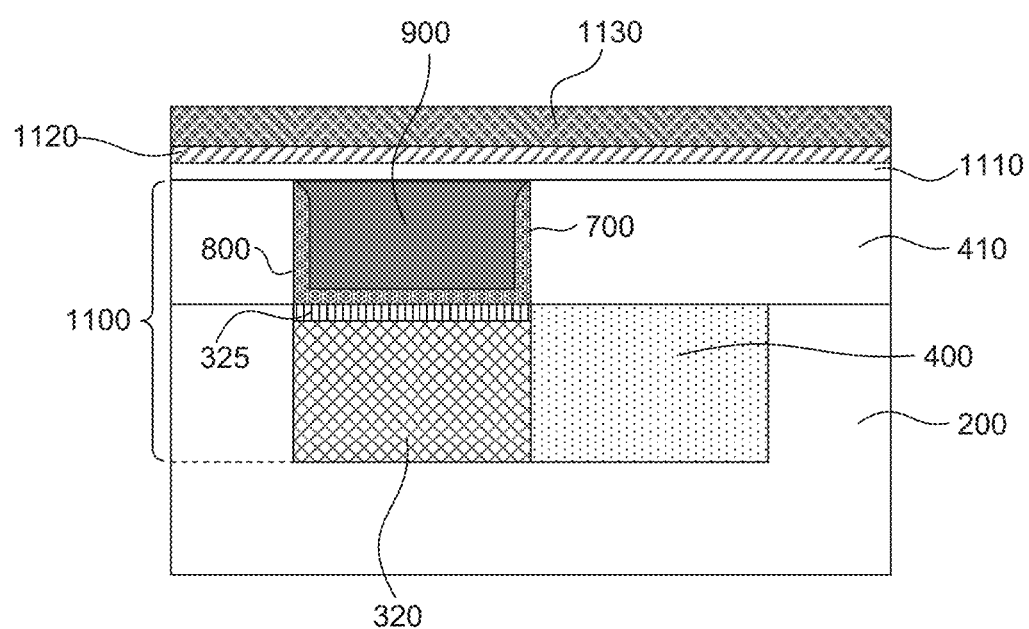
FIG. 11 is a cross-sectional view of silicon germanium epitaxial layer grown on a silicon seed layer in a recess within a silicon epitaxial layer after deposition of a silicon layer, an oxide layer, and a nitride layer, according to some embodiments.

In referring to FIG. 1, in operation 160 of exemplary fabrication process 100, portions of stack 1100 shown in FIG. 11 can be etched to form a fin, or fins, which can include a bottom section made of n-type region 320 with a top C-doped region 325, a middle section made of Si seed layer 800, and top section made of SiGe epitaxial layer 900, according to some embodiments. In some embodiments, fins can also be formed to include a bottom section made of p-type region 400 and a top section made of Si epitaxial layer 410.

By way of example and not limitation, the fin formation process may start with the deposition of a Si layer 1110 over the planarized surfaces of SiGe epitaxial layer 900 and Si epitaxial layer 410. In some embodiments, the thickness of Si layer 1110 can range from about 1 nm to about 10 nm (e.g., 3 nm) and can be grown with similar methods used to grow Si epitaxial layer 410. Subsequently, an oxide layer 1120 and a nitride layer 1130 can be deposited over Si layer 1110. Oxide, nitride, and Si layers (1110, 1120, and 1130, respectively) can protect the epitaxial layers 900 and 410 during subsequent etch processes. Photolithography can define the size and spacing (pitch) of the fins. A photoresist layer can be coated over the nitride layer. The photoresist can be then exposed and developed according to a desired pattern. The unexposed areas of the photoresist layer can be removed with a wet clean, leaving behind the desired pattern of developed photoresist on nitride layer 1130. For example, a desired pattern could be openings that would determine the desired fin-pitch (e.g., desired distance between fins) and fin width. The photoresist can act as an etch mask so that a portion of stack 1100 not masked by the photoresist can be removed.

Figure 12:
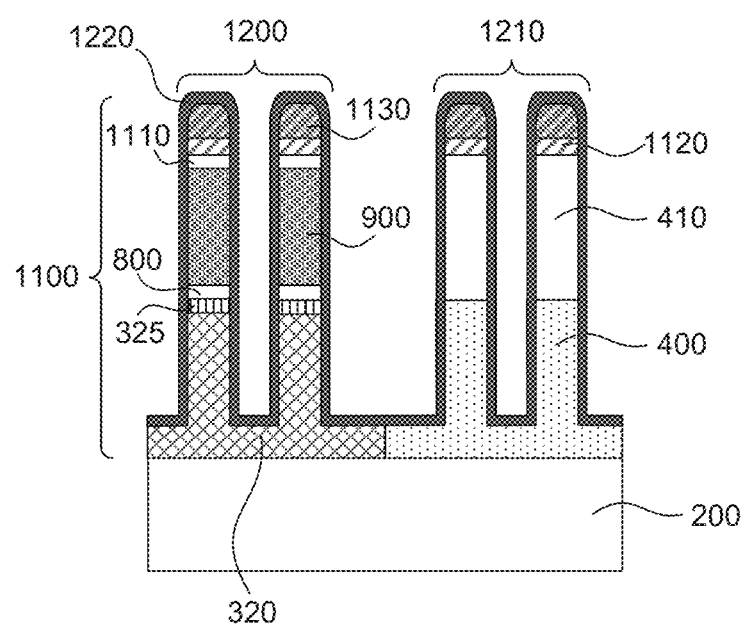
FIG. 12 is a cross-sectional view of fins with silicon germanium, and silicon epitaxial layers formed thereon, according to some embodiments.

By way of example and not limitation, the dry etch process may include several steps—each one of which can have a different etch chemistry depending on the material to be etched. After the etch process, the developed photoresist can be removed with a wet clean. According to some embodiments, the resulting fin structures 1200 and 1210 are shown in FIG. 12. By way of example and not limitation, the fin width (e.g., along the x-direction) can range from about 0.5 nm to about 500 nm. The number of fins shown in FIG. 12 are exemplary and not limiting. Therefore, fewer or additional fins may be possible depending on the fin pitch and the desired width of each fin. According to some embodiments, fins 1200 can include a bottom section of n-type region 320, a middle section of Si seed layer 800, and a top section of SiGe epitaxial layer 900. Fin structures 1210 can include a bottom section made of p-type region 400 and a top section made of Si epitaxial layer 410.

Figure 13:
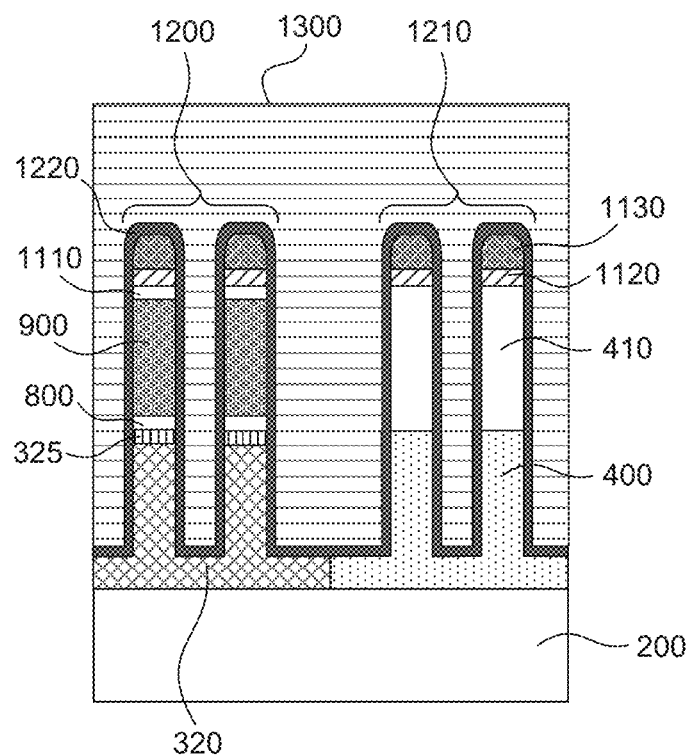
FIG. 13 is a cross-sectional view of fins with silicon germanium and silicon epitaxial layers after deposition of an isolation layer between the fins, according to some embodiments.

In some embodiments, a nitride liner 1220 can be deposited over fins 1200 and 1210 to cover the sidewall surfaces of fins 1200, 1210 and horizontal surfaces of p- and n-type regions 320 and 400, respectively. Nitride liner 1220 can be, for example, $Si_3N_4$. In some embodiments, nitride liner 1220 can provide structural support to fins 1200 and 1210 during subsequent processing. In some embodiments, an isolation layer 1300 can be deposited over fins 1200 and 1210 to fill the space between the fins and form an isolation region, as shown in FIG. 13. Isolation layer 1300 can be, for example, a shallow trench isolation (STI) made of silicon oxide, silicon nitride, silicon oxynitride, fluorine-doped silicate glass (FSG), a low-k dielectric material, and/or other suitable insulating material/dielectric material with appropriate fill properties. Additionally, the isolation layer may include a multi-layer structure, for example, having one or more layers containing a dielectric material. In some embodiments, the isolation layer may be deposited with CVD, plasma enhanced CVD (PECVD), or flowable CVD (FCVD).

Figure 14:
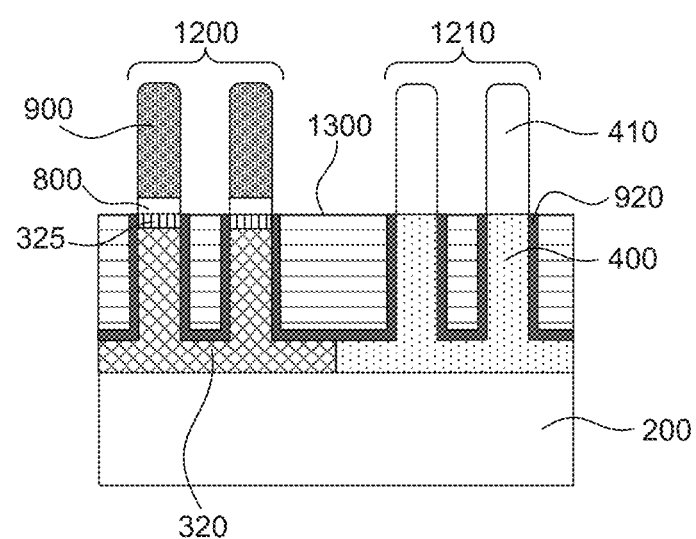
FIG. 14 is a cross-sectional view of fins with silicon germanium and silicon epitaxial layers after a recess process of an isolation layer located between the fins, according to some embodiments.

According to some embodiments, a CMP process can remove a portion of isolation layer 1300 over fins 1200 and 1210. In some embodiments, the CMP process can stop on nitride liner 1220. Subsequent etchback processes can recess isolation layer 1300 at the level of n- and p-type regions to form an isolation region as shown in FIG. 14 (e.g., at the level of C-doped region 325). During the aforementioned etchback operations, nitride layer 1130, oxide layer 1120, and Si layer 1110 can be removed. In addition, nitride liner 1220 can also be recessed to the level of isolation layer 1300.

The present disclosure is directed to an exemplary fabrication method of p-type or n-type fully strained channels that can mitigate epitaxial growth defects in a channel region such as, for example, stacking faults. In addition, the exemplary fabrication method can mitigate structural deformations in a channel region such as, for example, sidewall tapering or channel width widening, due to processing. According to some embodiments, the exemplary fabrication process can include a silicon fin with a top C-doped region. Forming an epitaxial silicon layer on the C-doped top region of the silicon fin. Forming a recess in the epitaxially grown silicon layer by etching the epitaxially grown silicon layer until the C-doped region of the silicon fin is exposed. Epitaxially growing a Si seed layer in the recess, and forming a SiGe layer to fill the recess. The Si see layer can repair the etched surface of the recess and suppress the appearance of growth defects such as, for example, {111} facets, in the SiGe epitaxial layer. In some embodiments, fins can be formed that can include a bottom section of an n-doped region with a C-doped top region, a middle section with a Si seed layer, and a top section with a SiGe epitaxial layer.

In some embodiments, a method includes a first doped region provided on a top portion of a substrate, where the first doped region comprises a second doped top region. A first epitaxial layer is grown on the second doped top region. A recess that is aligned to the second doped top region is formed in the first epitaxial layer, where forming the recess includes etching the first epitaxial layer until the second doped top region is exposed. Further forming a second epitaxial layer in the recess, where forming the second epitaxial layer includes: forming a seed layer in the recess and forming the second epitaxial layer on the seed layer to fill the recess at a higher temperature than the seed layer.

In some embodiments, a method includes an n-type region formed on a top portion of a substrate and a carbon-doped region formed in a top portion of the n-type region. A silicon epitaxial layer is grown on the carbon-doped region. Further, an isolation layer is formed on the silicon epitaxial layer and an opening that is aligned to the carbon-doped region is formed in the isolation layer to expose the silicon epitaxial layer. The silicon epitaxial layer is etched through the opening to form a recess that exposes the carbon-doped region. An epitaxial stack is formed in the recess, where forming the epitaxial stack includes: forming a seed layer in the recess and forming the epitaxial layer on the seed layer to fill the recess.

In some embodiments, a structure includes a fin over a substrate, where the fin includes: an n-type doped silicon region; a carbon-doped silicon region on the n-doped silicon region; a silicon seed layer on the carbon-doped silicon region; and an epitaxial layer over the silicon seed layer; a liner surrounding the n-type doped silicon region of the fin; and a dielectric material surrounding the liner.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing outlines features of embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a first doped region on a top portion of a substrate, wherein the first doped region comprises a second doped top region;
growing a first epitaxial layer on the second doped top region;
forming a recess in the first epitaxial layer that is aligned to the second doped top region, wherein forming the recess comprises etching the first epitaxial layer to expose the second doped top region;
after forming the recess, exposing the recess to an anneal and a plasma etch; and
forming a second epitaxial layer in the recess, wherein forming the second epitaxial layer comprises:
forming a seed layer in the recess at a first temperature higher than that of the anneal; and
forming the second epitaxial layer on the seed layer to fill the recess at a second temperature higher than the first temperature.

2. The method of claim 1, further comprising:
disposing a photoresist over the second epitaxial layer;
forming at least two openings in the photoresist to expose at least two respective portions of the second epitaxial layer; and
forming a fin, wherein the forming the fin comprises:
etching through the at least two openings in the photoresist to remove the second epitaxial layer, the seed layer; the second doped top region of the first doped region, and a portion of the first doped region; and
forming an isolation layer between multiple fins.

3. The method of claim 2, wherein the fin comprises the second doped top region of the first doped region, the seed layer, and the second epitaxial layer.

4. The method of claim 1; wherein the first doped region comprises an n-type silicon material.

5. The method of claim 1, wherein the second doped top region comprises a carbon-doped silicon material with a thickness between about 100 nm and about 5 μm.

6. The method of claim 5, wherein the carbon-doped silicon material has a carbon dopant concentration between $1\times10^{17}$ atoms/cm$^3$ and $1\times10^{20}$ atoms/cm$^3$.

7. The method of claim 1, wherein exposing the recess to the plasma etch comprises etching the recess with a nitrogen-based plasma.

8. The method of claim 1, wherein exposing the recess to the anneal comprises annealing the substrate to a temperature between about 30° C. and about 200° C.

9. The method of claim 1, wherein the second epitaxial layer comprises a top sub-layer and a bottom sub-layer.

10. The method of claim 9, wherein the top sub-layer has a variable germanium concentration profile that ranges from 0.001 atomic percent per nm to 0.2 atomic percent per nm.

11. The method of claim 9, wherein the top sub-layer has a variable germanium concentration profile that ranges from 0.3 atomic percent to 5 atomic percent.

12. The method of claim 9, wherein the bottom sub-layer has a constant germanium concentration profile that ranges from 10 atomic percent to 40 atomic percent.

13. A method, comprising:
forming an n-type region on a top portion of a substrate;
forming a carbon-doped region in a top portion of the n-type region;
growing a silicon epitaxial layer on the carbon-doped region;
forming a capping layer on the silicon epitaxial layer;
forming an opening aligned to the carbon-doped region in the capping layer to expose the silicon epitaxial layer;
etching the silicon epitaxial layer through the opening to form a recess and expose the carbon-doped region; and
forming an epitaxial stack in the recess, wherein the forming the epitaxial stack comprises:
performing a prebake;
forming a seed layer in the recess; and
forming the epitaxial layer on the seed layer to fill the recess, wherein the prebake is performed at a temperature between about 20% and about 30% higher than that of the epitaxial layer.

14. The method of claim 13, further comprising:
forming a fin structure, wherein the forming the fin structure comprises:
disposing a photoresist over the epitaxial layer of the epitaxial stack;
forming at least two openings in the photoresist to expose at least two respective portions of the epitaxial layer;
etching through the at least two openings in the photoresist to remove the epitaxial layer, the seed layer, the carbon-doped region, and a portion of the n-type region; and
forming an isolation layer between multiple fin structures.

15. The method of claim 13, wherein the epitaxial layer comprises silicon germanium with a thickness between 1 nm and 80 nm.

16. The method of claim 13, wherein the seed layer comprises silicon.

17. The method of claim 13, wherein the carbon-doped region has a thickness between 100 nm and 5000 nm.

18. A method, comprising:
forming n-type and p-type doped regions in a semiconductor substrate;
forming a carbon-doped region in a top portion of the n-type doped region;
growing a first epitaxial layer on the n-type and p-type doped regions;
etching an opening in the first epitaxial layer to expose the carbon-doped region, wherein the opening is aligned to the carbon-doped region and does not expose the p-type doped region;
performing a pre-clean and a first annealing at a first temperature to remove a native oxide from inner surfaces of the opening; and
epitaxially growing a second epitaxial layer to fill the opening, wherein epitaxially growing the second epitaxial layer comprises:
performing a second annealing at a higher second temperature than the first annealing;
epitaxially growing a seed layer on the inner surfaces of the opening; and
epitaxially growing a silicon-germanium layer on the seed layer to fill the opening.

19. The method of claim 18, further comprising:
etching the second epitaxial layer, the n-type doped region, and a portion of the substrate below the n-type doped region to form a fin comprising a carbon-doped layer interposed between the n-type doped region and the second epitaxial layer.

20. The method of claim 18, further comprising:
  etching the first epitaxial layer, the p-type doped region, and a portion of the substrate below the p-type doped region to form a fin comprising the p-type doped region and the first epitaxial layer.

* * * * *